United States Patent

Sessions

[11] Patent Number: 5,994,925
[45] Date of Patent: Nov. 30, 1999

[54] PSEUDO-DIFFERENTIAL LOGIC RECEIVER

[75] Inventor: D. C. Sessions, Phoeniz, Ariz.

[73] Assignee: VLSI Technology, Inc., San Jose, Calif.

[21] Appl. No.: 09/059,631

[22] Filed: Apr. 13, 1998

[51] Int. Cl.[6] .............................................. A03K 19/094
[52] U.S. Cl. ............................... 326/121; 326/34; 326/83
[58] Field of Search .................................. 326/31–34, 82, 326/83, 86, 112, 119, 121

[56] References Cited

U.S. PATENT DOCUMENTS

| 4,255,723 | 3/1981 | Ebihara | 326/86 |
| 5,376,843 | 12/1994 | Tien et al. | 326/112 |
| 5,455,520 | 10/1995 | Honda | 326/86 |
| 5,550,487 | 8/1996 | Lyon | 326/33 |
| 5,900,741 | 5/1999 | Roohparvar | 326/34 |

OTHER PUBLICATIONS

Wang, et al., *IEEE Journal of Solid–State Circuits*, vol. 33, No. 4, Apr. 1988.

*Primary Examiner*—Michael Tokar
*Assistant Examiner*—Don Phu Le
*Attorney, Agent, or Firm*—Burns, Doane, Swecker & Mathis, L.L.P.

[57] ABSTRACT

A pseudo-differential receiver is described which includes a bias generator circuit portion for providing a bias signal to a receiver circuit portion. The bias generator includes first and second load devices for establishing bias voltages at first and second nodes and also includes a first CMOS inverter biased by and coupled between the first and second nodes. The input of the first inverter is coupled to a reference voltage and the output of the inverter provides a bias voltage which is fed back to the gates of the first and second load devices. The biasing conditions on the first and second nodes bias the first inverter such that the threshold voltage of the first CMOS inverter is equal to the reference voltage. The biasing signal is used to bias loading devices in the receiver circuit portion. The receiver circuit portion includes loading and inverter devices that are electrically matched to the loading and inverter devices in the bias generator circuit portion. As a result, the bias signal biases the receiver circuit loading devices such that the receiver circuit has the same threshold as the bias generator circuit which is equal to the input reference voltage coupled to the bias generator. The bias voltage provided by the bias generator can be used to bias other receiver circuit so as to minimize input receiver size and current in larger integrated circuit designs.

4 Claims, 4 Drawing Sheets

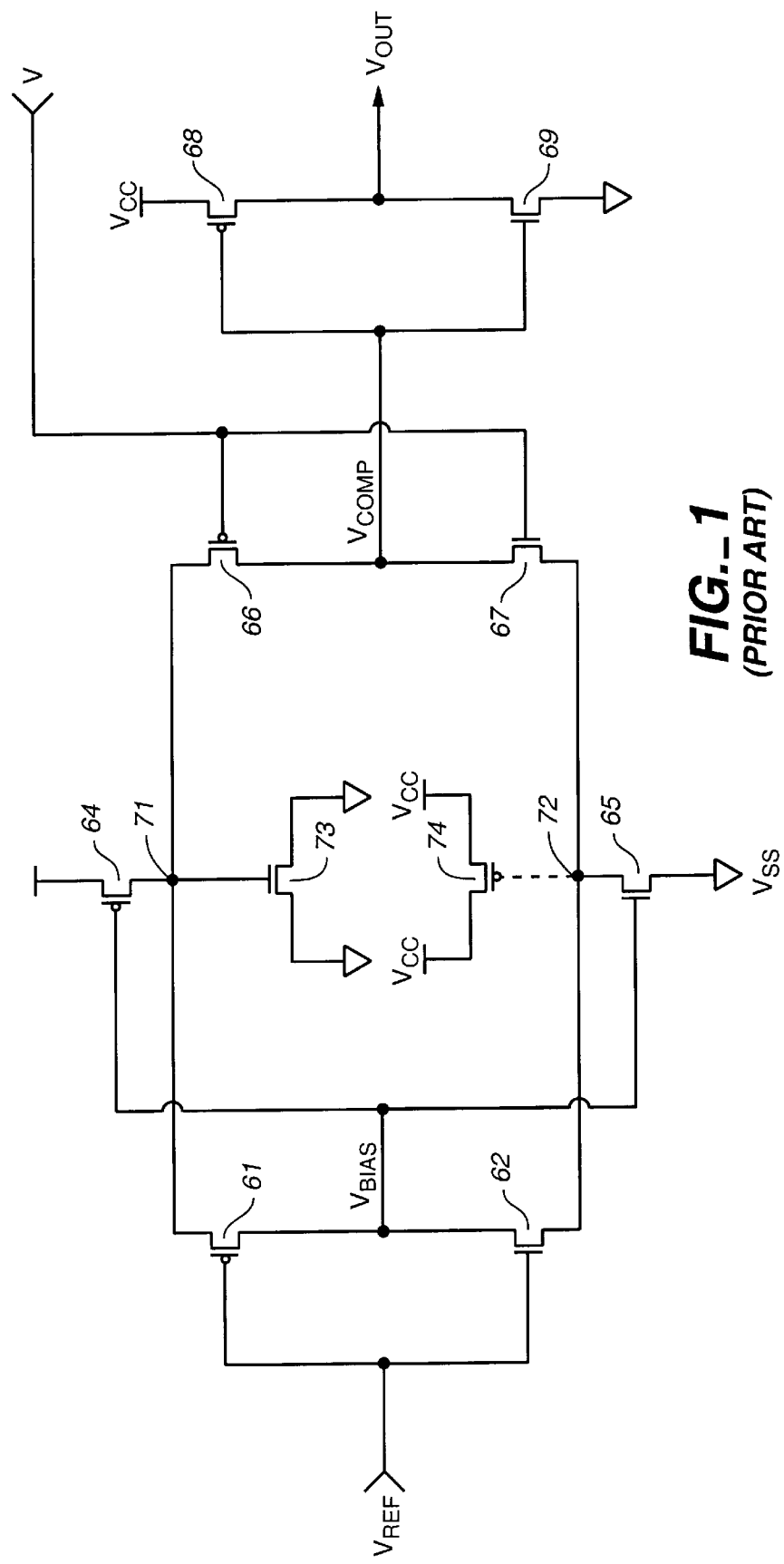
FIG._1
*(PRIOR ART)*

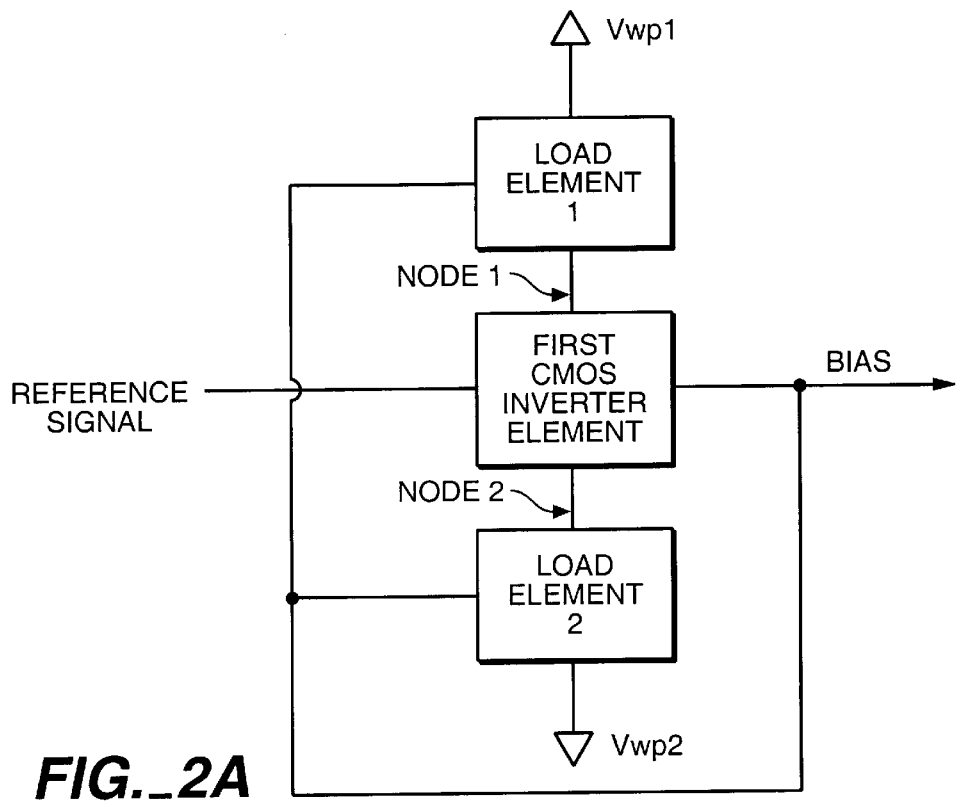
FIG._2A
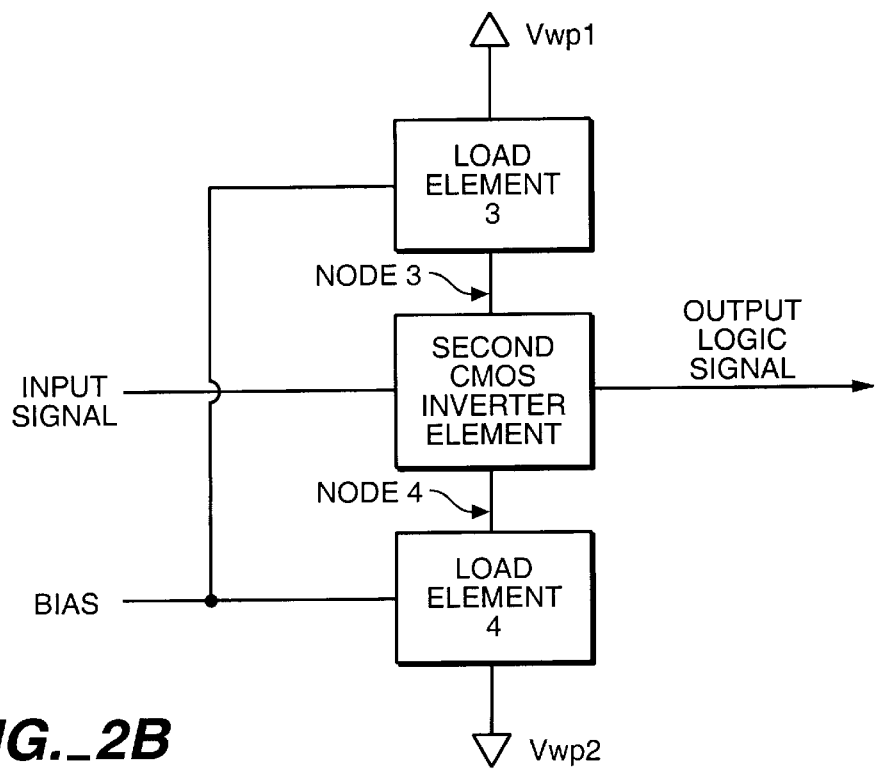
FIG._2B

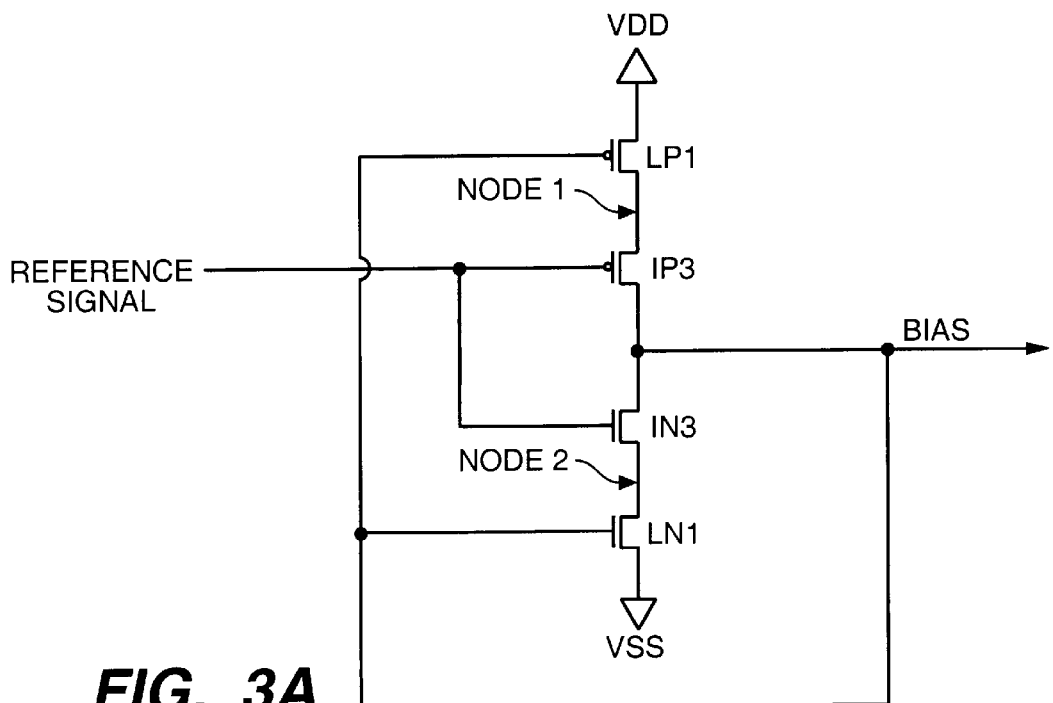
FIG._3A
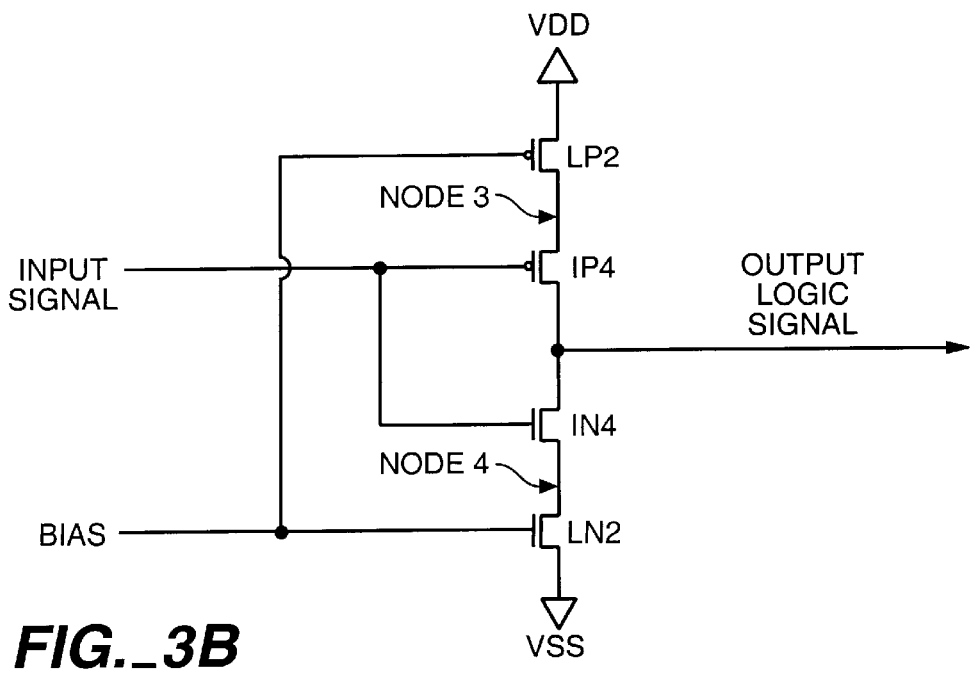
FIG._3B

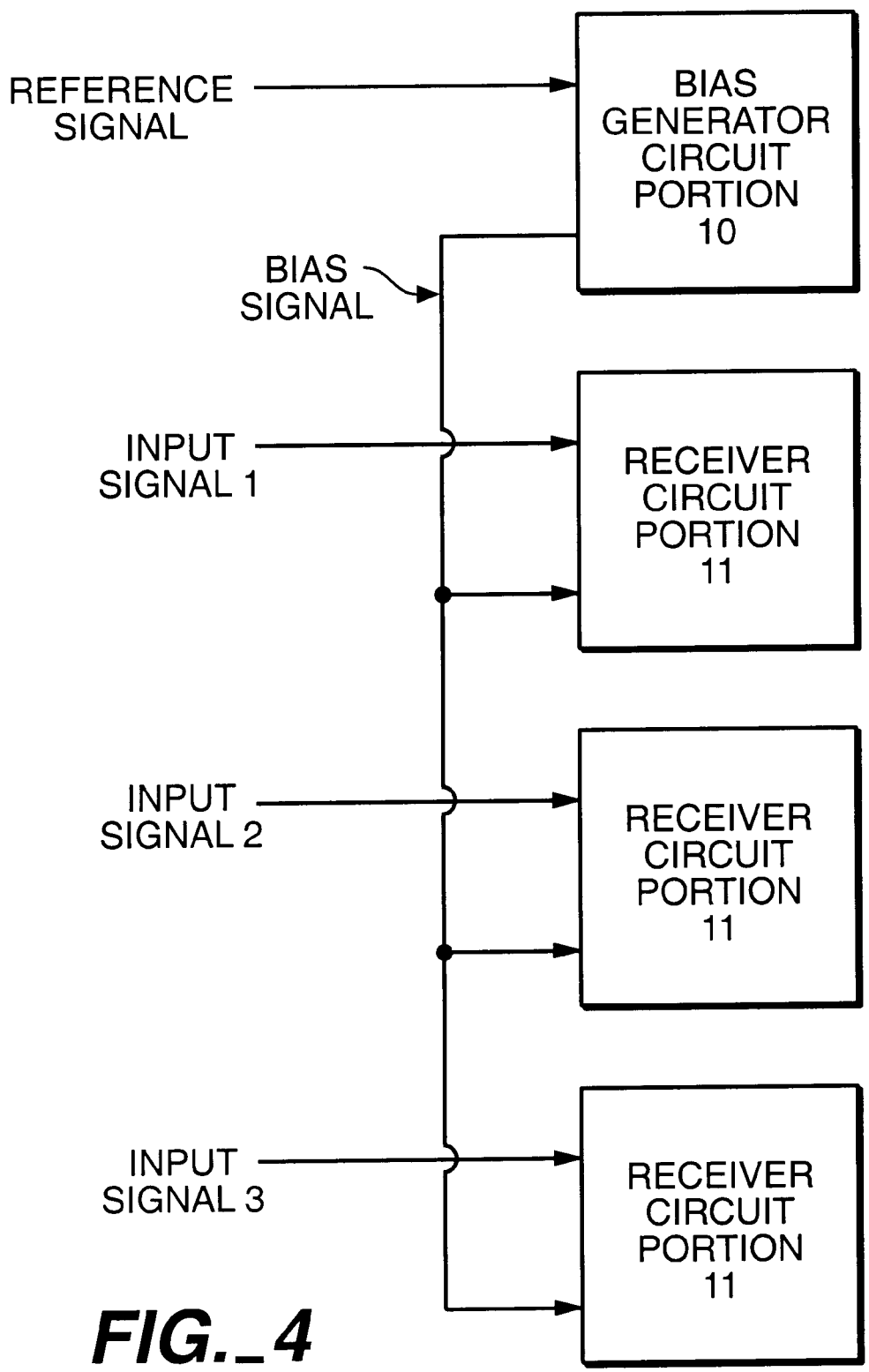
FIG._4

PSEUDO-DIFFERENTIAL LOGIC RECEIVER

BACKGROUND OF THE INVENTION

1. Field of the Invention

The present invention relates to logic receivers, and more particularly to CMOS inverter-type receivers.

2. State of the Art

Logic receivers (also sometimes referred to as level shifters or input buffers) are used to accept an input signal and output a logic signal having a logic state representative of the voltage level of the input signal which can then be coupled to other logic circuitry. They can be classified as non-differential or differential in that they are either responsive only to an input signal (non-differential) or to the difference between two input signals (differential). An example of a differential receiver might be a differential amplifier. An example of a non-differential receiver might be as simple as an MOS switching device or a basic CMOS inverter. Although differential receivers tend to be more precise since they compare the input signal to a controlled reference signal, they also tend to require more circuitry to accommodate this type of comparison and accuracy. In contrast, non-differential receivers tend to require fewer elements and hence take up less space, but are less accurate than their differential counterpart due to device dependent operating fluctuations.

One important aspect of a receiver is its associated threshold voltage. The threshold voltage determines whether the input signal causes the input receiver to output a HIGH logic level or a LOW logic level. Specifically, if the input signal is higher than the threshold voltage, the receiver outputs a voltage corresponding to a first logic state and when the input signal is lower than the threshold voltage, the receiver outputs a voltage corresponding to a second logic state. Hence, the threshold voltage determines the accurate interpretation or detection of the input signal. Other important aspects of prior art receivers are their speeds, gains, and power dissipations.

FIG. 1 shows a typical prior art differential receiver as disclosed in U.S. Pat. No. 4,937,476 which includes two parallel inverters (device pairs 61/62 and 66/67) coupled between two biasing devices (64 and 65). The first inverter has its input coupled to a reference voltage (Vref) and its output signal (Vbias) coupled to the gates of the biasing devices 64 and 65. The biasing devices establish bias voltages on two summing nodes 71 and 72 so as to bias the second inverter such that its threshold voltage is equal to the reference voltage coupled to the input of the first inverter. The second inverter has its input coupled to the input signal (Vin) and drives a third inverter (devices 68/69) with an output signal (Vcomp) which represents the comparison result of Vin to the second inverter's threshold voltage (i.e., Vref). The third inverter outputs signal Vout which is the logical representation of the input signal in response to Vcomp. Although the receiver shown in FIG. 1 provides the accuracy of a differential receiver by using a reference voltage to establish its threshold voltage, these types of receivers dissipate power no matter what level the input signal is at as well as requiring a relatively large number of elements to provide this accuracy.

The present invention is a receiver that provides the accuracy of a differential receiver while significantly reducing power dissipation and the number of components typically required to obtain this accuracy.

SUMMARY OF THE INVENTION

A pseudo-differential receiver is described which includes a bias generator circuit having its input coupled to a reference signal which biases one or more receiver circuits so as to have a threshold voltage equal to the reference signal. The bias generator circuit outputs a bias signal which is fed back to its load elements such that a threshold voltage equal to the reference signal is established in the bias generator circuit. The receiver circuit has load elements that match the load elements in the bias generator circuit and has its input coupled to the input signal. The bias signal from the bias generator circuit is coupled to the receiver circuit's load elements causing the bias signal to bias the receiver circuit such that it has the same threshold voltage as the reference signal coupled to the bias generator circuit. The receiver circuit then outputs a logic signal representative of the input signal. The output logic signal has HIGH and LOW logic level voltages dependent on the conductivities of the biased receiver circuit's load elements and dependent on the threshold voltage established by the bias signal provided from the bias generator circuit. Since the pseudo-differential receiver is responsive to a differential signal created by the input reference signal and the input signal, it provides the accuracy of a differential-type input receiver. However, since a single bias generator circuit can be used to bias more than one receiver circuit, receiver power and size is reduced when more than one receiver is implemented in a system.

The bias generator circuit includes first and second load elements for establishing bias voltages at first and second nodes and also includes a first CMOS inverter element biased by and coupled between the first and second nodes. The input of the first inverter element is coupled to a reference signal and the output of the inverter provides a bias signal which is fed back to the first and second load elements and modulates the conductivities of the loads so as to establish a threshold voltage in the first CMOS inverter element equal to the reference voltage.

The receiver circuit includes third and fourth load elements coupled to the bias signal. The third and fourth load elements are matched to the first and second load elements such that the bias signal modulates the conductivities of the third and fourth load elements so as to establish bias voltages on third and fourth nodes that are the same as the bias voltages on the first and second nodes. The receiver also includes a second CMOS inverter element coupled between the third and fourth nodes having matching device characteristics as the first CMOS inverter element. Since the third and fourth load elements establish the same bias conditions as the first and second load elements and since the devices of the second CMOS inverter element are matched to that of the first CMOS inverter element, the receiver circuit has the same threshold as the bias generator circuit which is equal to the reference signal. The bias signal provided by the bias generator can be used to bias other receiver circuits so as to minimize overall input receiver size and current in larger integrated circuit designs requiring many input receivers.

In one embodiment, first and second load elements are a first PMOS device and a first NMOS device, respectively, and third and fourth load elements are a second PMOS device and a second NMOS device, respectively such that the first and second PMOS devices and the first and second NMOS devices have matching W/L dimensions.

In one embodiment, the first CMOS inverter element includes a third PMOS device coupled in series with a third NMOS device having their gates coupled together and coupled to the reference signal and the second CMOS inverter element includes a fourth PMOS device coupled in series with a fourth NMOS device having their gates coupled together and coupled to the input signal. In this case, the first and second CMOS inverters are matched in that the third and fourth PMOS devices and the third and fourth NMOS have matching W/L dimensions.

BRIEF DESCRIPTION OF THE DRAWINGS

The present invention may be further understood from the following written description in conjunction with the appended drawings. In the drawings:

FIG. 1 shows a prior art differential receiver;

FIG. 2A shows a bias generator circuit portion of an embodiment of the receiving circuit of the present invention;

FIG. 2B shows a receiver circuit portion of an embodiment of the receiving circuit of the present invention;

FIG. 3A shows a circuit implementation of the bias generator circuit portion shown in FIG. 2A;

FIG. 3B shows a circuit implementation of the receiver circuit portion shown in FIG. 2B.

FIG. 4 shows a single bias generator circuit portion biasing more than one receiver circuit portions.

DETAILED DESCRIPTION OF THE PREFERRED EMBODIMENTS

The present invention, in general, is a circuit for receiving an input signal and outputting a logic signal representative of the input signal. FIGS. 2A and 2B show block diagrams of a bias generator circuit portion (FIG. 2A) of the receiving circuit of the present invention and a receiver circuit portion (FIG. 2B) of the receiving circuit of the present invention.

The bias generator circuit portion (FIG. 2A) includes load element 1 coupled between a first working potential (VWP1) and node 1 and includes load element 2 coupled between a second working potential (VWP2) and node 2. Load elements 1 and 2 establish bias conditions on nodes 1 and 2, respectively, in response to the bias signal fed back from the output of the bias generator circuit portion. Between nodes 1 and 2 is coupled a first CMOS inverter element which has its input coupled to the reference signal. The first CMOS inverter element outputs a bias signal dependent on the bias conditions established on the first and second nodes and dependent on the reference signal. In addition, the feedback bias signal coupled to load elements 1 and 2 causes the threshold voltage of the first inverter element to equal the input reference signal.

The receiver circuit portion (FIG. 2B) includes load element 3 coupled between the first working potential and node 3 and includes load element 4 coupled between the second working potential and node 4. Load element 3 is matched to load element 1 and load element 4 is matched to load element 2 so as to have the same linear region operating characteristics. Load elements 3 and 4 are biased by the bias signal provided from the bias generator circuit portion (FIG. 2A) such that they establish bias conditions on nodes 3 and 4 that are the same as nodes 1 and 2, respectively, due to the load matching. The first CMOS inverter element and the second CMOS inverter element are also matched. As a result, the bias conditions set up on nodes 3 and 4 cause the second CMOS inverter element to have the same threshold as the first CMOS inverter element, i.e., the reference signal (FIG. 2A).

It should be noted that the matched first and second CMOS inverter elements can comprise various CMOS inverter designs which are well know in the field of circuit design and is not restricted to any particular CMOS inverter design. Furthermore, the matched first, second, third and fourth load elements can comprise a variety of loading designs which are well known in the field of circuit design and is not restricted to any particular load element design.

In a preferred embodiment, loading and CMOS inverter elements are implemented as shown in FIGS. 3A and 3B. FIG. 3A shows the MOS circuit implementation of the bias generator circuit portion shown in FIG. 2A which includes a first PMOS loading device LP1 coupled between VDD and node 1 and a first NMOS loading device LN1 coupled between node 2 and VSS. Coupled between nodes 1 and 2 is a first CMOS inverter including devices IP3 and IN3 having their gates connected together. The CMOS inverter has its input coupled to the reference signal and outputs the bias signal which is fed back to the gates of loading devices LP1 and LN1. Loading devices LP1 and LN1 are biased by the bias signal so as to establish first and second biasing conditions on nodes 1 and 2, respectively. As a result, the CMOS inverter is biased by nodes 1 and 2 so as to have a threshold voltage equal to the reference signal.

FIG. 3B shows the MOS circuit implementation of the receiver circuit portion shown in FIG. 2B which includes a second PMOS loading device LP2 coupled between VDD and node 3 and a second NMOS loading device LN2 coupled between node 4 and VSS. Coupled between nodes 3 and 4 is a second CMOS inverter including devices IP4 and IN4 having their gates connected together. The second CMOS inverter has its input coupled to the input signal and outputs a logic signal representative of the input signal. The bias signal generated by the bias generator circuit shown in FIG. 3A is coupled to the gates of loading devices LP2 and LN2. Loading device LP2 is matched to loading device LP1 and loading device LN2 is matched to loading device LN1 (i.e., matching W/L dimensions) such that they are biased to establish biasing conditions on nodes 3 and 4 that are the same as the biasing conditions established on nodes 1 and 2 (FIG. 3A), respectively. In addition, device IP4 is matched to device IP3 and device IN4 is matched to device IN3. As a result, the second CMOS inverter comprised of devices IP4 and IN4 is biased by nodes 3 and 4 so as to have a threshold voltage equal to the reference signal.

The bias generator circuit portion (FIGS. 2A and 3A) can be used to establish a bias voltage for more than one receiver circuit portion (FIGS. 2B and 3B). FIG. 4 shows a single bias generator circuit portion 10 which is biased by a reference signal. The bias generator circuit portion 10 provides a bias signal to more than one receiver circuit portion 11 each having a different input signal (input signals 1–3). The bias signal biases each receiver circuit portions 11 so as to have a threshold voltage equal to the reference signal. Moreover, more than one bias generator circuit portion (not shown) can be employed in the case in which it is desired to bias other receiver circuit portions 11 to have different threshold voltages.

Hence, a receiving circuit including the bias generator circuit portion (FIGS. 2A and 3A) and the receiver circuit portion (FIGS. 2B and 3B) provide the accuracy of a differential receiving circuit in that it establishes a precise threshold voltage for comparing to an input signal using a reference signal, yet consumes less power and space than prior art receivers. In particular, the receiving portion of the present invention only dissipates power when the input signal is in the vicinity of the threshold voltage.

In the preceding description, numerous specific details are set forth, such as MOS device type and logic states in order to provide a thorough understanding of the present invention. It will be apparent, however, to one skilled in the art that these specific details need not be employed to practice the present invention. In other instances, well known logic elements and device theory have not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What is claimed is:

1. A circuit for receiving an input signal and outputting a logic signal representative of said input signal comprising:

a first circuit portion including:

first and second loading means for establishing first and second biasing conditions, respectively, on first and second nodes, respectively, in response to a bias voltage;

a first CMOS inverter element coupled between said first and second nodes for outputting said bias voltage in response to an input reference voltage and said first and second biasing conditions;

at least one of a second circuit portion including:

third and fourth loading means for establishing said first and second biasing conditions on third and fourth nodes, respectively, in response to said bias voltage;

a second CMOS inverter element having an input coupled to said input signal and being coupled between said third and fourth nodes, said second inverter having an associated threshold voltage, said second inverter outputting said logic signal dependent on said associated threshold voltage, wherein said associated threshold voltage is essentially equivalent to said input reference voltage.

2. The circuit as described in claim 1 wherein said first and second loading means are a first PMOS device and a first NMOS device, respectively, having their gates coupled to said bias voltage, said first PMOS device being coupled between a first working potential and said first node and said first NMOS device being coupled between a second working potential and said second node and wherein said third and fourth loading means are a second PMOS device and a second NMOS device, respectively, having their gates coupled to said bias voltage, said second PMOS device being coupled between said first working potential and said third node and said second NMOS device being coupled between said second working potential and said fourth node wherein said first and second PMOS devices have the same W/L gate dimensions and said first and second NMOS devices have the same W/L gate dimensions.

3. The circuit as described in claim 2 wherein said first CMOS inverter element comprises a third PMOS device and a third NMOS device coupled in series between said first and second nodes and having their gates coupled together and to said reference signal and wherein said second CMOS inverter element comprises a fourth PMOS device and a fourth NMOS device coupled in series between said third and fourth nodes and having their gates coupled together and to said input signal, said third PMOS and said fourth PMOS having the same W/L gate dimensions and said third NMOS and said fourth PMOS having the same W/L gate dimensions.

4. The circuit as described in claim 1 wherein said circuit comprises a plurality of second circuit portions each having said second inverter coupled to a different input signal and said first circuit portion provides said bias voltage to each of said third and fourth loading means of said plurality of second circuit portions.

* * * * *